(12) United States Patent
Pentlehner et al.

(10) Patent No.: US 10,608,197 B2
(45) Date of Patent: Mar. 31, 2020

(54) ORGANIC LIGHT-EMITTING COMPONENT AND LAMP

(71) Applicant: OSRAM OLED GmbH, Regensburg (DE)

(72) Inventors: Dominik Pentlehner, Burghausen (DE); Carola Diez, Regensburg (DE); Ulrich Niedermeier, Leiblfing (DE); Andreas Rausch, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/752,570

(22) PCT Filed: Aug. 24, 2016

(86) PCT No.: PCT/EP2016/069981
§ 371 (c)(1),
(2) Date: Feb. 13, 2018

(87) PCT Pub. No.: WO2017/032802
PCT Pub. Date: Mar. 2, 2017

(65) Prior Publication Data
US 2018/0240994 A1    Aug. 23, 2018

(30) Foreign Application Priority Data
Aug. 25, 2015 (DE) .................. 10 2015 114 084

(51) Int. Cl.
*H01L 51/50* (2006.01)
*H01L 51/52* (2006.01)
*H01L 51/00* (2006.01)

(52) U.S. Cl.
CPC ...... *H01L 51/5044* (2013.01); *H01L 51/5278* (2013.01); *H01L 51/0078* (2013.01); *H01L 2251/301* (2013.01); *H01L 2251/558* (2013.01)

(58) Field of Classification Search
CPC ............ H01L 51/5044; H01L 51/5278; H01L 51/0078
See application file for complete search history.

(56) References Cited

U.S. PATENT DOCUMENTS

2009/0195146 A1* 8/2009 Hatwar ............... H01L 27/3209
313/504
2011/0240971 A1* 10/2011 Nowatari ............ H01L 51/0078
257/40
(Continued)

FOREIGN PATENT DOCUMENTS

CN      104253243 A    12/2014
DE   102012202839 A1    8/2013
(Continued)

*Primary Examiner* — Christine A Enad
(74) *Attorney, Agent, or Firm* — McDermott Will & Emery LLP

(57) ABSTRACT

The invention relates to an organic light-emitting component (100), comprising a functional layer stack (9) between two electrodes (1, 8), wherein the functional layer stack (9) has at least two organic light-emitting layers (2, 7) and at least one charge carrier generation zone (3), which is arranged between the two organic light-emitting layers (2, 7), wherein the charge carrier generation zone (3) comprises an electron-conducting organic layer (31) and a hole-conducting organic layer (32), between which an intermediate region (4) is arranged, wherein the intermediate region (4) comprises at least one organic intermediate layer (6) which has a first charge carrier transport mechanism and an inorganic intermediate layer (5) which has a second charge carrier transport mechanism, wherein the inorganic intermediate layer (5) is arranged between the organic intermediate layer (6) and the electron-conducting organic layer (31), and wherein the first charge carrier transport mechanism is at least partially different to the second charge carrier transport mechanism.

16 Claims, 6 Drawing Sheets

(56) References Cited

U.S. PATENT DOCUMENTS

2012/0261652 A1* 10/2012 Rothe ................. H01L 51/0015
                                                               257/40
2014/0246663 A1    9/2014 Kambe et al.
2015/0023023 A1*  1/2015 Livesay ............... H01L 33/642
                                                              362/294
2015/0076469 A1    3/2015 Ikemizu et al.
2016/0293896 A1* 10/2016 Rausch ............... H01L 51/5036

FOREIGN PATENT DOCUMENTS

| | | |
|---|---|---|
| DE | 102012204327 A1 | 9/2013 |
| DE | 102013107113 A1 | 1/2015 |
| DE | 102013017361 A1 | 4/2015 |
| DE | 102014100993 A1 | 6/2015 |
| WO | 2010/066245 A1 | 6/2010 |
| WO | 2015/082394 A1 | 6/2015 |

* cited by examiner

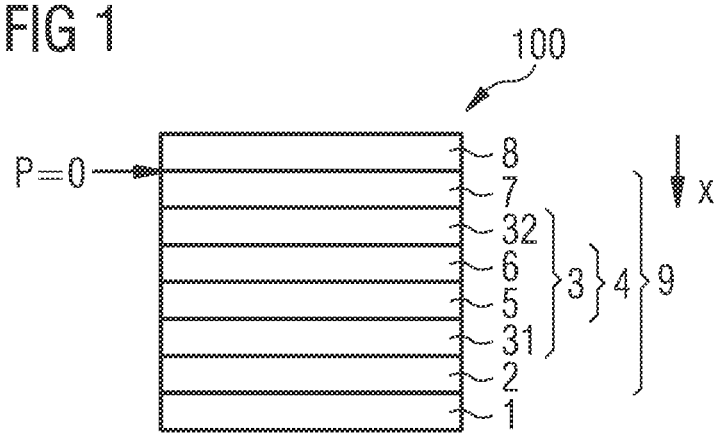
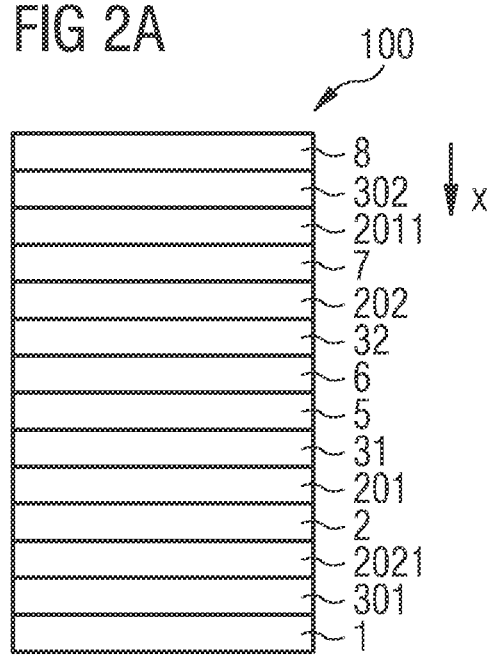

FIG 2B

| | L [cd/m2] | Peff [lm/W] | Ieff [cd/A] | EQE [%] | Cx | Cy | U [V] | I [mA/cm2] | LT70 [h] 50° C, 100 mA/cm2 | LT70 [h] 85° C, 50 mA/cm2 | LT70 [h] 95° C, 50 mA/cm2 |
|---|---|---|---|---|---|---|---|---|---|---|---|
| V1 | 2600 | 2,3 | 7,6 | 14,24% | 0,691 | 0,308 | 10,5 | 34,8 | 740 | 770 | 400 |
| A1 | 2600 | 2,6 | 7,8 | 13,92% | 0,692 | 0,307 | 9,5 | 32,4 | 840 | 780 | 400 |
| V2 | 1800 | 1,9 | 6,2 | 13,31% | 0,691 | 0,307 | 10,1 | 28,7 | 710 | 570 | 320 |
| A2 | 1800 | 2,4 | 7,0 | 14,23% | 0,692 | 0,306 | 9,1 | 26,9 | 880 | 740 | 360 |

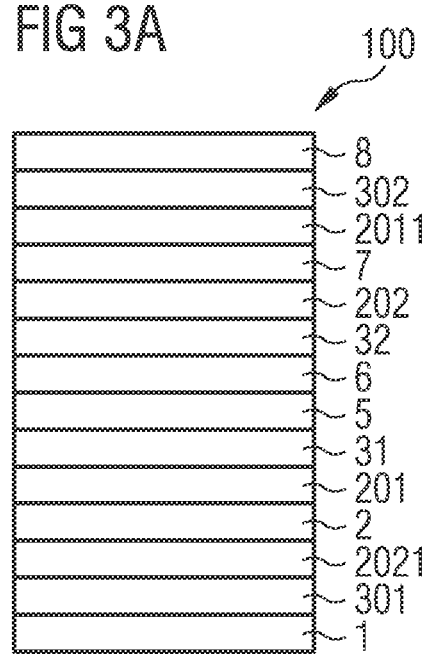

FIG 3B

| | L [cd/m²] | Peff [lm/W] | Ieff [cd/A] | EQE [%] | Cx | Cy | U [V] | I [mA/cm²] | LT70 [h] 85° C, 50/100 mA/cm2 |
|---|---|---|---|---|---|---|---|---|---|
| V3 | 1700 | 3,1 | 9,5 | 20,37% | 0,699 | 0,300 | 9,6 | 18,5 | 1200/600 |
| A3 | 1500 | 3,2 | 9,2 | 19,36% | 0,698 | 0,301 | 8,9 | 16,4 | 1400/650 |
| V4 | 1700 | 3,3 | 9,8 | 20,62% | 0,698 | 0,300 | 9,3 | 17,3 | 1200/600 |
| A4 | 1500 | 3,3 | 9,4 | 19,49% | 0,698 | 0,301 | 9,0 | 16,5 | 1700/750 |

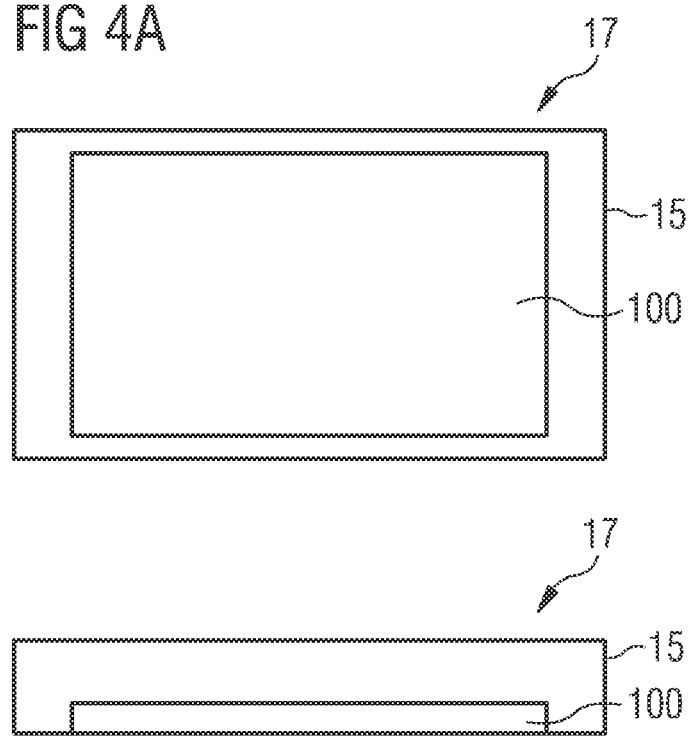
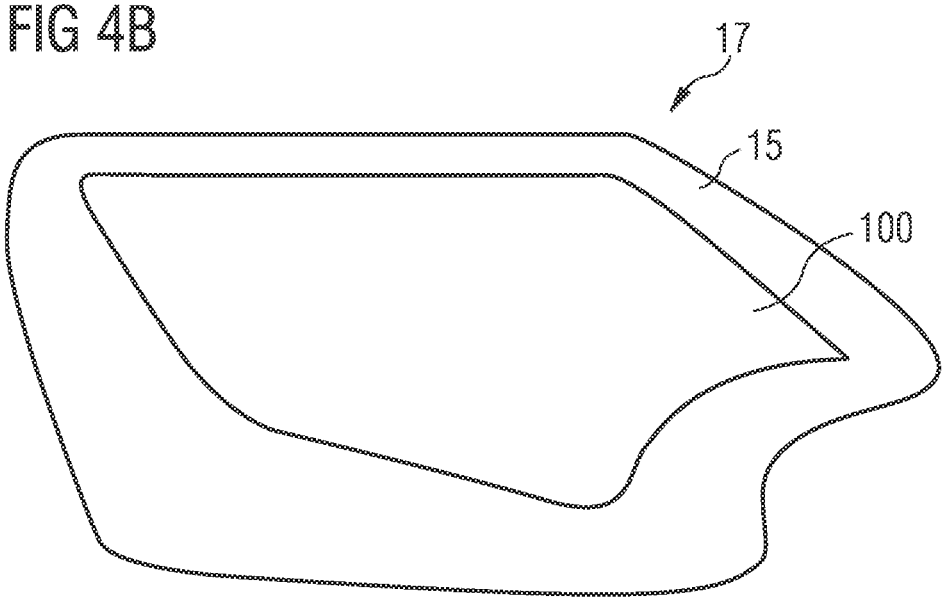

ORGANIC LIGHT-EMITTING COMPONENT AND LAMP

CROSS-REFERENCE OF RELATED APPLICATIONS

This application is the U.S. National Phase under 35 U.S.C. § 371 of International Patent Application No. PCT/EP2016/069981, filed on Aug. 24, 2016, which in turn claims the benefit of German Application No. 10 2015 114 084.5, filed on Aug. 25, 2015, the entire disclosures of which Applications are incorporated by reference herein.

The invention relates to an organic light-emitting component. The invention further relates to a lamp, in particular a tail light.

The aim of the invention is to provide an organic light-emitting component which is stable at high temperatures, in particular at temperatures greater than 85° C. The aim of the invention is to provide a lamp which can be used at high temperatures, in particular at temperatures greater than 85° C.

These objects are achieved by an organic light-emitting component according to independent claim 1. Advantageous embodiments and developments of the invention are the subject matter of the dependent claims. Furthermore, these objects are solved by a lamp according to independent claim 16. Advantageous embodiments and developments of the back light are the subject matter of dependent claim 17.

In at least one embodiment, the organic light-emitting component comprises a functional layer stack. The functional layer stack is arranged between two electrodes. The functional layer stack has at least two organic light-emitting layers and at least one charge carrier generation zone. The charge carrier generation zone is arranged between the two organic light-emitting layers.

The charge carrier generation zone has an electron-conducting organic layer. The charge carrier generation zone has a hole-conducting organic layer. An intermediate region is arranged between the electron-conducting organic layer and the hole-conducting organic layer. The intermediate region has an organic intermediate layer. The organic intermediate layer preferably has a first charge carrier transport mechanism. The intermediate region has an inorganic intermediate layer. The inorganic intermediate layer preferably has a second charge carrier transport mechanism. The inorganic intermediate layer is arranged between the organic intermediate layer and the electron-conducting organic layer. In addition, the first charge carrier transport mechanism can at least partially differ from the second charge carrier transport mechanism.

In addition, the organic intermediate layer can comprise a material which is selected from a group consisting of phthalocyanine, a phthalocyanine derivative, naphthalocyanine, a naphthalocyanine derivative, a porphyrin and a porphyrin derivative; and the inorganic intermediate layer can have at least one metal or semi-metal, which is selected from a group consisting of Li, Na, K, Rb, Cs, Be, Mg, Ca, Sr, Ba, B, Al, Ag, Yb, Ga, In, Tl and combinations thereof.

According to at least one embodiment, the organic light-emitting component is an organic light-emitting diode (OLED). The organic light-emitting component comprises at least two organic light-emitting layers. Said organic light-emitting layers can be stacked vertically.

By using at least two vertically stacked organic light-emitting layers, higher efficiency and stability can be achieved. The organic light-emitting layers stacked one above the other are spatially separated from one another by at least one charge carrier generation zone ("charge generation layer", short CGL). As a result, it is possible for each charge carrier pair which is injected into such a stack to generate a plurality of photons, since the charge carrier generation zone acts as internal anodes and cathodes. In particular, the component is operable to emit and to set up radiation, i.e. is capable of emitting.

According to at least one embodiment, the organic light-emitting component comprises a functional layer stack. In particular, the functional layer stack is formed from predominantly organic layers. Here and in the following, "predominantly organic layers" means that the functional layer stack has mainly organic layers, wherein at least the intermediate region can also have inorganic layers, for example the inorganic intermediate layer.

The functional layer stack can contain layers comprising organic polymers, organic oligomers, organic monomers, organic small non-polymeric molecules ("small molecules") or combinations thereof. The functional layer stack can have, in addition to the at least two organic light-emitting layers, at least one functional layer which is designed as a hole-transport layer, in order to enable effective hole injection in at least one of the light-emitting layers. Suitable materials for a hole-transport layer are to be advantageous, for example tertiary amines, carbazole derivatives, polyaniline doped with casein sulfonic acid or polyethylene dioxythiophene doped with polystyrene sulfonic acid. The functional layer stack can furthermore have at least one functional layer which is formed as an electron transport layer. In general, the functional layer stack can comprise, in addition to the at least two organic light-emitting layers, further layers, which are selected from hole injection layers, hole transport layers, electron injection layers, electron transport layers, hole blocking layers and electron blocking layers.

The material for a hole-blocking layer can be selected from a group consisting of 2,2',2"-(1,3,5-Benzinetriyl)-tris(1-phenyl-1-H-benzimidazole),
2-(4-Biphenylyl)-5-(4-tert-butylphenyl)-1,3,4-oxadiazole,
2,9-Dimethyl-4,7-diphenyl-1,10-phenanthroline (BCP),
8-Hydroxyquinolinolato-lithium,
4-(Naphthalen-1-yl)-3,5-diphenyl-4H-1,2,4-triazole,
1,3-Bis[2-(2,2'-bipyridine-6-yl)-1,3,4-oxadiazo-5-yl]benzole,
4,7-Diphenyl-1,10-phenanthroline (BPhen)1,
3-(4-Biphenylyl)-4-phenyl-5-tert-butylphenyl-1,2,4-triazole,
Bis(2-methyl-8-quinolinolate)-4-(phenylphenolato)aluminum,
6,6'-Bis[5-(biphenyl-4-yl)-1,3,4-oxadiazo-2-yl]-2,2'-bipyridyl,
2-phenyl-9,10-di(naphthalen-2-yl)-anthracene,
2,7-Bis[2-(2,2'-bipyridine-6-yl)-1,3,4-oxadiazo-5-yl]-9,9-dimethylfluorene,
1,3-Bis[2-(4-tert-butylphenyl)-1,3,4-oxadiazo-5-yl]benzole,
2-(naphthalen-2-yl)-4,7-diphenyl-1,10-phenanthroline,
2,9-Bis(naphthalen-2-yl)-4,7-diphenyl-1,10-phenanthroline,
Tris(2,4,6-trimethyl-3-(pyridin-3-yl)phenyl)borane,
1-methyl-2-(4-(naphthalen-2-yl)phenyl)-1H-imidazo[4,5-f][1,10]phenanthrolin,
Phenyl-dipyrenylphosphines oxide,
Naphthalene tetracarboxylic dianhydride and its imides,
Perylenetetracarboxylic dianhydride and its imides,
materials based on silanols with a silacyclopentadienoic unit,
and mixtures thereof.

The material for an electron-blocking layer can be selected from a group consisting of
NPB (N,N'-Bis(naphthalen-1-yl)-N,N'-bis(phenyl)-benzidine),
beta-NPB N,N'-Bis(naphthalen-2-yl)-N,N'-bis(phenyl)-benzidine),
TPD (N,N'-Bis(3-methylphenyl)-N,N'-bis(phenyl)-benzidine),
Spiro TPD (N,N'-Bis(3-methylphenyl)-N,N'-bis(phenyl)-benzidine),
Spiro-NPB (N,N'-Bis(naphthalen-1-yl)-N,N'-bis(phenyl)-spiro),
DMFL-TPD N,N'-Bis(3-methylphenyl)-N,N'-bis(phenyl)-9,9-dimethyl-fluorene),
DMFL-NPB (N,N'-Bis(naphthalen-1-yl)-N,N'-bis(phenyl)-9,9-dimethyl-fluorene),
DPFL-TPD (N,N'-Bis(3-methylphenyl)-N,N'-bis(phenyl)-9,9-diphenyl-fluorene),
DPFL-NPB (N,N'-Bis(naphthalen-1-yl)-N,N'-bis(phenyl)-9,9-diphenyl-fluorene),
Spiro-TAD (2,2',7,7'-Tetrakis(n,n-diphenylamino)-9,9'-spirobifluorene),
9,9-Bis[4-(N,N-bis-biphenyl-4-yl-amino)phenyl]-9H-fluorene,
9,9-Bis[4-(N,N-bis-naphthalen-2-yl-amino)phenyl]-9H-fluorene,
9,9-Bis[4-(N,N'-bis-naphthalen-2-yl-N,N'-bis-phenyl-amino)-phenyl]-9H-fluoro,
N,N'-bis(phenanthren-9-yl)-N,N'-bis(phenyl)-benzidine,
2,7-Bis[N,N-bis(9,9-spiro-bifluorene-2-yl)-amino]-9,9-spiro-bifluorene,
2,2'-Bis[N,N-bis(biphenyl-4-yl)amino]9,9-spiro-bifluorene,
2,2'-Bis(N,N-di-phenyl-amino)9,9-spiro-bifluorene,
Di-[4-(N,N-ditolyl-amino)-phenyl]cyclohexane,
2,2',7,7'-tetra(N, N-di-tolyl)amino-spiro-bifluorene,
N,N,N',N'-tetra-naphthalen-2-yl-benzidine,
and mixtures thereof.

According to at least one embodiment, an organic light-emitting component has at least two electrodes. In particular, the functional layer stack is arranged between the two electrodes.

According to at least one embodiment, at least one of the electrodes is transparent. Here and hereinafter, "transparent" denotes a layer which is transmissive to visible light. In this case, the transparent layer can be clearly translucent or at least partially light-diffusing and/or partially light-absorbing, so that the transparent layer can, for example, also be diffusely or milkily translucent. Particularly preferably, a layer which is referred to here as transparent is as light-transmissive as possible, so that in particular the absorption of light or radiation generated during operation of the component in the functional layer stack is as low as possible.

According to at least one embodiment, both electrodes are transparent. The light generated in the at least two light-emitting layers can thus be radiated in both directions, i.e. through both electrodes. In the event that the organic light-emitting component has a substrate, this means that the light both passes through the substrate, which is then likewise transparent, and can be radiated into the direction facing away from the substrate. Furthermore, in this case, all layers of the organic light-emitting component can be transparent, so that the organic light-emitting component forms a transparent OLED. In addition, it can also be possible for one of the two electrodes, between which the functional layer stack is arranged, not to be transparent but preferably reflective, so that the light generated in the at least two light-emitting layers can be emitted only in one direction through the transparent electrode. In particular, this direction is the main beam direction or main direction x. If the electrode arranged on the substrate is transparent and the substrate is also transparent, this is also referred to as a so-called bottom emitter, while in the case where the electrode arranged to face away from the substrate is transparent, this is referred to as a so-called top emitter.

According to at least one embodiment, one electrode is transparent and the further electrode is formed to be reflective, so that the radiation generated in the organic light-emitting layers is coupled out in the main direction x via the transparent electrode. In particular, the transparent electrode is arranged on a substrate, which is then likewise transparent. The component is then formed as a so-called bottom emitter.

A transparent conductive oxide, for example, can be used as the material for a transparent electrode. Transparent conductive oxides, briefly "TCOs", are generally metal oxides, such as, for example, zinc oxide, tin oxide, cadmium oxide, titanium oxide, indium oxide or indium tin oxide (ITO) in addition to binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or admixtures of different transparent conductive oxides to the group of TCOs. In this case, the TCOs do not necessarily correspond to a stoichiometric composition and can furthermore be p-doped or n-doped. In particular, the transparent material is indium tin oxide (ITO).

According to at least one embodiment, the organic light-emitting component has a substrate. In particular, one of the two electrodes is arranged on the substrate. The substrate can have, for example, one or more materials in the form of a layer, a plate, a film or a laminate, which are selected from glass, quartz, plastic, metal, silicon, wafer. In particular, the substrate comprises glass or consists thereof.

According to at least one embodiment, the organic light-emitting component has two or more than two organic light-emitting layers, for example three, four or five. The at least two organic light-emitting layers can each have the same organic materials. In particular, the at least two organic light-emitting layers then emit radiation in an identical, for example red or yellow, wavelength range. Alternatively, the at least two organic light-emitting layers have at least two different organic materials. In particular, the at least two organic light-emitting layers then emit radiation of different wavelength ranges, for example of the red, green and/or blue wavelength range. The organic materials can in each case be fluorescent and/or phosphorescent materials. Organic or organometallic compounds, such as derivatives of polyfluorene, are preferably used as organic materials, polythiophene and polyphenylene, for example 2- or 2,5-substituted poly-p-phenylene vinylene and/or metal complexes, for example iridium complexes, such as blue-phosphorescent FIrPic (Bis (3,5-difluoro-2-(2-pyridyl)phenyl-(2-carboxypyridyl)-iridium III), green-phosphorescent $Ir(ppy)_3$ (Tris(2-phenylpyridin)iridium III) and/or red phosphorescent Ru (dtb-bpy)$_3$*2(PF$_6$) (Tris[4,4'-di-tert-butyl-(2,2')-bipyridin]ruthenium(III)komplexe), and blue fluorescent DPAVBi (4,4-Bis[4-(di-p-tolylamino)styryl]biphenylen), green fluorescent TTPA (9,10-Bis[N,N-di-(p-tolyl)-amino]anthracene) and/or red fluorescent DCM2 (4-Dicyanomethylen)-2-methyl-6-julolidyl-9-enyl-4H-pyrane) is used as the non-polymeric emitter.

With regard to the basic structure of an organic light-emitting component, in particular with regard to the structure, the layer composition and the materials of the organic functional layer stacks, reference is made to the publication WO 2010/066245 A1, which is hereby expressly incorporated by reference.

According to at least one embodiment, the at least two organic light-emitting layers each have a red-emitting organic material and a green-emitting organic material. It is possible for the at least two organic light-emitting layers to have only the two cited organic materials and at least no further emitting materials.

According to at least one embodiment of the light-emitting diode, the at least two organic light-emitting layers have a blue-emitting organic material and additionally a green-emitting organic material. Preferably, no further organic material is then present.

According to at least one embodiment of the light-emitting diode, the at least two organic light-emitting layers have a red-emitting organic material and additionally a green-emitting organic material, the other organic light-emitting layer comprises a blue-emitting organic material. Preferably, no further organic material is then present.

According to at least one embodiment of the light-emitting diode, the at least two organic light-emitting layers have a blue-emitting organic material and additionally a green-emitting organic material, the other organic light-emitting layer comprises a red-emitting organic material. Preferably, no further organic material is then present.

According to at least one embodiment of the light-emitting diode, one of the at least two organic light-emitting layers has a yellow-emitting organic material and the other a blue-emitting organic material. Preferably, no further organic material is then present.

In particular, the component is set up for this purpose to emit light from the red wavelength range or light from the white wavelength range.

According to at least one embodiment, the organic light-emitting component has three organic light-emitting layers. The first organic light-emitting layer comprises, in particular, a material which emits radiation from the blue wavelength range. The second organic light-emitting layer comprises, in particular, a material which emits radiation from the green wavelength range. The third organic light-emitting layer comprises, in particular, a material which emits radiation from the red wavelength range. The component can thus emit white light. In particular, the component can be used in a daytime running light for an automobile or for general lighting.

According to at least one embodiment, the at least two organic light-emitting layers are set up for this purpose to emit radiation from the red wavelength range. Preferably, the dominant wavelength of the red wavelength range has a value of 625 nm with a tolerance of 5 nm, 4 nm, 3 nm, 2 nm or 1 nm from this value.

According to at least one embodiment, the organic light-emitting component has a charge carrier generation zone. The charge carrier generation zone is arranged between the two organic light-emitting layers. A layer sequence is described here and in the following with a charge carrier generation zone, which is generally formed by a pn-junction. The charge carrier generation zone, which is also referred to as a so-called "charge generation layer" (CGL), is formed in particular as a pn-junction forming a tunnel junction, which is operated in the reverse direction and which can be used for effective charge separation and thus for generating charge carriers. The charge carrier generation zone connects at least the two organic light-emitting layers to one another. The stability of the component can thus be increased.

A layer, an element or a zone being arranged "between" two other layers or elements or zones, can mean here and in the following that the one layer or the one element or the one zone is arranged in such a way that it is in direct mechanical and/or electrical contact or in indirect contact with one of the two other layers or elements or zones and in direct mechanical and/or electrical contact or in indirect contact with the other layers or elements or zones. In this case of indirect contact, further layers and/or elements and/or zones can be arranged between the one and at least one of the two other layers or zones or between the one and at least one of the two other elements.

According to at least one embodiment, the charge carrier generation zone has a hole-conducting and electron-conducting organic layer. In particular, the hole-conducting and electron-conducting organic layer can be a p-doped and n-doped organic layer. The term "p- and/or n-doped organic layer" is used here and below in the meaning of being characterized in that the organic layer is doped with a further material which is different from the organic layer. In this case, n-doped means that the doped organic layer is electron-conducting predominantly, that is to say as a main function. In this case, p-doped means that the organic layer is hole-conducting predominantly, that is to say as a main function. As materials for a hole-conducting and electron-conducting organic layer, in particular a p- and/or n-doped organic layer, any materials which are hole-conducting or electron-conducting are suitable. These are known to the person skilled in the art and are therefore not explained in more detail at this point.

The material for a hole-transport layer and/or hole-conducting layer can be selected from a group consisting of HAT-CN, F16CuPc, LG-101, □-NPD, NPB (N,N'-Bis(naphthalen-1-yl)-N,N'-bis(phenyl)-benzidine), beta-NPB N,N'-Bis(naphthalen-2-yl)-N,N'-bis(phenyl)-benzidine), TPD (N,N'-Bis(3-methylphenyl)-N,N'-bis(phenyl)-benzidine), Spiro TPD (N,N'-Bis(3-methylphenyl)-N,N'-bis(phenyl)-benzidine), Spiro-NPB (N,N'-Bis(naphthalen-1-yl)-N,N'-bis(phenyl)-spiro), DMFL-TPD N,N'-Bis(3-methylphenyl)-N,N'-bis(phenyl)-9,9-dimethyl-fluorene), DMFL-NPB (N,N'-Bis(naphthalen-1-yl)-N,N'-bis(phenyl)-9,9-dimethyl-fluorene), DPFL-TPD (N,N'-Bis(3-methylphenyl)-N,N'-bis(phenyl)-9,9-diphenyl-fluorene), DPFL-NPB (N,N'-Bis(naphthalen-1-yl)-N,N'-bis(phenyl)-9,9-diphenyl-fluorene), Spiro-TAD (2,2',7,7'-Tetraki s(N,N-diphenylamino)-9,9'-spirobifluorene), 9,9-Bis[4-(N,N-bis-biphenyl-4-yl-amino)phenyl]-9H-fluorene, 9,9-Bis[4-(N,N-bis-naphthalen-2-yl-amino)phenyl]-9H-fluorene, 9,9-Bis[4-(N,N'-bis-naphthalen-2-yl-N,N'-bis-phenyl-amino)-phenyl]-9H-fluor, N,N'-bis(phenanthren-9-yl)-N,N'-bis(phenyl)-benzidine, 2,7-Bis[N,N-bis(9,9-spiro-bifluorene-2-yl)-amino]-9,9-spiro-bifluorene, 2,2'-Bis[N,N-bis(biphenyl-4-yl)amino]9,9-spiro-bifluorene, 2,2'-Bis(N,N-di-phenyl-amino)9,9-spiro-bifluorene, Di-[4-(N,N-ditolyl-amino)-phenyl]cyclohexane, 2,2',7,7'-tetra(N,N-di-tolyl)amino-spiro-bifluorene, N,N,N',N'-tetra-naphthalen-2-yl-benzidine, HTM081, HTM163, HTM222, NHT49, NHT51 and mixtures of these compounds. One or more materials selected from a group consisting of $MoO_x$, $WO_x$, $VO_x$, Cu(I)pFBz (pFBz: Pentafluorobenzoate), Bi(III)pFBz, F4-TCNQ (2,3,5,6-Tetrafluoro-7,7,8,8-tetracyanoquinodimethane), NDP-2 und NDP-9 can be used as the p-type dopant. The terms HTM081, HTM163, HTM222, NHT49, NHT51, NET-18, NET-218, ET093, ETM020, ETM033, ETM034, ETM036, NDN-1 and NDN-26 are product company names of the companies Merck, Novaled and/or Idemitsu.

The material for an electron-transport layer and/or electron-conducting layer can be selected from a group consisting of NET-18, NET-218, ET093, ETM020, ETM033, ETM034, ETM036, 2,2',2"-(1,3,5-Benzinetriyl)-tris(1-phenyl-1-H-benzimidazole), 2-(4-Biphenylyl)-5-(4-tert-butylphenyl)-1,3,4-oxadiazole, 2,9-Dimethyl-4,7-diphenyl-1,10-phenanthroline (BCP), 8-Hydroxyquinolinolato-lithium, 4-(Naphthalen-1-yl)-3,5-diphenyl-4H-1,2,4-triazole, 1,3-Bis[2-(2,2'-bipyridine-6-yl)-1,3,4-oxadiazo-5-yl]benzene, 4,7-Diphenyl-1,10-phenanthroline (BPhen), 3-(4-Biphenylyl)-4-phenyl-5-tert-butylphenyl-1,2,4-triazol, Bis(2-methyl-8-quinolinolate)-4-(phenylphenolato)aluminum, 6,6'-Bis[5-(biphenyl-4-yl)-1,3,4-oxadiazo-2-yl]-2,2'-bipyridyl, 2-phenyl-9,10-di(naphthalen-2-yl)-anthracene, 2,7-Bis[2-(2,2'-bipyridine-6-yl)-1,3,4-oxadiazo-5-yl]-9,9-dimethylfluorene, 1,3-Bis[2-(4-tert-butylphenyl)-1,3,4-oxadiazo-5-yl]benzene, 2-(naphthalen-2-yl)-4,7-diphenyl-1,10-phenanthroline, 2,9-Bis(naphthalen-2-yl)-4,7-diphenyl-1,10-phenanthroline, Tris(2,4,6-trimethyl-3-(pyridin-3-yl)phenyl)borane, 1-methyl-2-(4-(naphthalen-2-yl)phenyl)-1H-imidazo[4,5-f][1,10]phenanthroline, Phenyldipyrenylphosphinoxide, Naphtahlintetracarbonaciddianhydride und its Imides, Perylentetracarbonaciddianhydride und its Imides, Materials based on silanols having a silacyclopentadienoic acid unit and mixtures of the aforementioned substances. The n-type dopant used may be one or more materials selected from a group consisting of NDN-1, NDN-26, Na, Ca, Mg, Ag, Cs, Li, Mg, Yb, $Cs_2CO_3$ und $Cs_3PO_4$.

According to at least one embodiment, an intermediate region is arranged between the electron-conducting organic layer and the hole-conducting organic layer. In particular, the intermediate region is arranged directly adjacent, that is to say in direct mechanical and/or electrical contact, to the electron-conducting organic layer as well as to the hole-conducting organic layer. In particular, the hole-conducting and electron-conducting organic layers are connected to one another via the intermediate region.

According to at least one embodiment, the intermediate region has an organic intermediate layer and an inorganic intermediate layer or consists thereof. In particular, the organic intermediate layer has a first charge carrier transport mechanism and the inorganic intermediate layer has a second charge carrier transport mechanism.

The intermediate layer can be formed from insulating materials, for example aluminum oxide. In this case, the intermediate layer represents a tunnel barrier for the charge carriers. At the same time, the intermediate layer separates the hole-conducting and electron-conducting organic layers, which would otherwise possibly react with one another at the interface and would thus lose their respective function in the component. This increases the stability of the component.

The term "first charge carrier transport mechanism" can be understood here to mean that the organic interlayer has materials which have intermediate states which increase the tunneling probability. The charge carriers can then additionally move between the hole-conducting and the electron-conducting organic layer in addition to the "tunneling" through the so-called hopping mechanism from intermediate state to intermediate state of the material of the organic intermediate layer. As a result, the efficiency of the component can be increased.

The inorganic intermediate layer has a second charge carrier transport mechanism. The second charge carrier transport mechanism transports the charge carriers through "tunnels", it thus represents a tunnel barrier for the charge carriers. The second charge carrier transport mechanism has no hopping mechanism in comparison to the first charge carrier transport mechanism, since the materials of the inorganic intermediate layer do not have any intermediate states which would induce a hopping mechanism. The first charge carrier transport mechanism thus differs at least partially from the second charge carrier transport mechanism.

The inventors have recognized that a device can be provided which is characterized by a high temperature stability, preferably a stability at temperatures greater than 50° C., greater than 60° C., greater than 80° C., greater than 85° C. or greater than 95° C., by using an intermediate region from one organic intermediate layer having a first charge carrier transport mechanism in combination with one inorganic intermediate layer having a second charge carrier transport mechanism, which partially differs from the first charge carrier transport mechanism. With constant efficiency, the stability of the component, in particular of the OLED, is significantly increased at high temperatures. This means that the voltage drop and the change in the voltage drop across the charge carrier generation zone is extremely low and the service life can be increased significantly compared to a component which has either an inorganic intermediate layer or an organic intermediate layer as an intermediate region. The voltage rise due to operation or storage, in particular at high temperatures, can also be reduced by the component according to the invention. Combination means here a vertical sequence of the intermediate layers, wherein the inorganic layer and the electron-conducting, the organic layer adjoins the hole-conducting layer.

According to at least one embodiment, the organic intermediate layer comprises at least one material, or a combination of the materials, which is/are selected from the group consisting of phthalocyanine, at least one or exactly one phthalocyanine derivative, naphthalocyanine, at least one or exactly one naphthalocyanine derivative, porphyrin and at least one or exactly one porphyrin derivative.

According to at least one embodiment, the organic intermediate layer comprises at least one phthalocyanine and/or a phathalocyanine derivative or consists thereof. The phthalocyanine and/or phthalocyanine derivative is coordinated in each case on a metal or a metal compound. The metal or the metal compound is selected from a group comprising copper (Cu), zinc (Zn), cobalt (Co), aluminum (Al), nickel (Ni), iron (Fe), tin oxide (SnO), manganese (Mn), magnesium (Mg), vanadium oxide (VO) and titanium oxide (TiO).

In principle, the materials disclosed in DE 10 201 3 107 113 A1 and/or DE 10 201 0 017 361 A1 and/or DE 10 201 2 204 327 A1 can be used for the organic intermediate layer. The disclosure content of the above-mentioned publications is hereby incorporated by reference.

According to at least one embodiment, the inorganic intermediate layer comprises at least one metal or semimetal, which is selected from a group consisting of lithium (Li), sodium (Na), potassium (K), rubidium (Rb), cesium (Cs), beryllium (Be), magnesium (Mg), calcium (Ca), strontium (Sr), barium (Ba), boron (B), aluminum (Al), silver (Ag), ytterbium (Yb), gallium (Ga), indium (In), thallium (Tl) and combinations thereof.

According to at least one embodiment, the inorganic intermediate layer comprises or consists of a non-noble metal. In particular, the inorganic intermediate layer is designed as an n-type dopant. The inorganic intermediate layer is preferably formed from calcium and/or calcium is set up as an n-type dopant. Calcium increases the band bending at the interface, i.e. it therefore acts as an n-type dopant at the interface to the electron-conducting organic layer and simultaneously separates the electron-conducting and hole-conducting organic layers from one another, which means that it has an insulating effect.

According to at least one embodiment, the organic intermediate layer comprises or consists of a phthalocyanine and/or phthalocyanine derivative. Alternatively or additionally, the inorganic intermediate layer comprises or consists of aluminum, magnesium, ytterbium or calcium.

In particular, the organic intermediate layer comprises a phthalocyanine and the inorganic intermediate layer comprises aluminum. Alternatively, the intermediate layers consist of said materials.

In particular, the organic intermediate layer comprises a phthalocyanine derivative and the inorganic intermediate layer comprises aluminum. Alternatively, the intermediate layers consist of said materials.

In particular, the organic intermediate layer comprises a phthalocyanine and the inorganic intermediate layer comprises calcium. Alternatively, the intermediate layers consist of said materials.

In particular, the organic intermediate layer comprises a phthalocyanine derivative and the inorganic intermediate layer comprises calcium. Alternatively, the intermediate layers consist of said materials.

In particular, the organic intermediate layer comprises a phthalocyanine and the inorganic intermediate layer comprises magnesium. Alternatively, the intermediate layers consist of said materials.

In particular, the organic intermediate layer comprises a phthalocyanine derivative and the inorganic intermediate layer comprises magnesium. Alternatively, the intermediate layers consist of said materials.

In particular, the organic intermediate layer comprises a phthalocyanine and the inorganic intermediate layer comprises ytterbium. Alternatively, the intermediate layers consist of said materials.

In particular, the organic intermediate layer comprises a phthalocyanine derivative and the inorganic intermediate layer comprises ytterbium. Alternatively, the intermediate layers consist of said materials.

According to at least one embodiment, the organic intermediate layer comprises a vanadyl phthalocyanine, copper phthalocyanine and/or titanyl phthalocyanine. The inorganic layer alternatively or additionally comprises calcium or consists thereof. Thus, a charge carrier generation zone can be provided which is resistant to degradation at high temperatures of greater than 85° C.

According to at least one embodiment, the organic intermediate layer and the inorganic intermediate layer each have a layer thickness of between 0.5 nm and 10 nm inclusive, in particular of between 1 nm and 6 nm inclusive. In particular, the layer thickness of the inorganic intermediate layer is smaller than or equal to the layer thickness of the organic intermediate layer. The organic intermediate layer preferably has a layer thickness of between 2 nm and 6 nm inclusive and/or the inorganic intermediate layer has a layer thickness of between 0.5 nm and 6 nm inclusive, for example of between 0.5 nm and 3 nm inclusive.

According to at least one embodiment, the charge carrier generation zone has a total thickness of less than or equal to 240 nm, in particular less than or equal to 180 nm, preferably 120 nm or 60 nm. In particular, the charge carrier generation zone has a layer thickness of at least 30 nm, for example 35 nm.

The total thickness of the charge carrier generation zone results from the sum of the thicknesses of the layers of the charge carrier generation zone, that is to say at least from the sum of the thicknesses of the electron-conducting organic layer, of the hole-conducting organic layer, the inorganic intermediate layer and the organic intermediate layer.

According to at least one embodiment, the individual organic light-emitting layers are located along a main direction x, in each case at a position P according to the following formula $P=\lambda/(4n)+k\lambda(2n)$. The position P is preferably is maintained with a tolerance of at most $\lambda/(10n)$ or of at most $\lambda(20n)$. The position information relates in particular to one geometric centre of the associated organic light-emitting layer. "n" designates the average refractive index of the functional layer stack, which is, for example, between 1.7 and 1.9 inclusive. The wavelength $\lambda$ denotes the vacuum wavelength of the radiation, for the production of which the corresponding organic light-emitting layer is set up. "k" is a natural number greater than or equal to zero. In particular, $k=0$, $k=1$, $k=2$ or $k=3$. The coupling-out efficiency of the radiation generated by the organic light-emitting layers can thus be increased.

According to at least one embodiment, the following applies to a first organic light-emitting layer of the at least two organic light-emitting layers, wherein $k=0$ or $k=1$.

According to at least one embodiment, the following applies to a second organic light-emitting layer of the at least two organic light-emitting layers, characterized in that $k>0$. In particular, $k=$ or $k=1$ or $k=2$.

In particular, the zero position is the interface between the further electrode, which is in particular shaped to be reflective, and the functional layer stack. The main direction x denotes the direction of radiation of the organic light-emitting layers in the direction of the layer normal, in particular, the main direction x is away from the position zero.

A requirement for the use of a charge carrier generation zone in a component is, on the one hand, a low voltage drop across the charge carrier generation zone and a minimum change in the voltage drop across the charge carrier generation zone during operation of the component, in particular an OLED, under the desired operating conditions, especially at high temperatures such as occur in the automobile sector, for example. On the other hand, a prerequisite for the use of a charge carrier generation zone is the highest possible transmission in the spectral range emitted by the component, in order to avoid absorption losses of the emitted light.

According to at least one embodiment, the component is arranged at a temperature of greater than 70° C. or 75° C., in particular greater than 85° C., and is stable with respect to degradation. In particular, the charge carrier generation zone is stable with respect to such high temperatures in comparison to a conventional comparable OLED having only one simple intermediate layer or in which the voltage rise to LT70 is less than 20% and/or LT70 (85° C.) is greater than 5000 h.

The stability of a component, in particular at high temperatures, is often limited by the charge carrier generation zone. This is expressed in that the percentage voltage rise and luminance drop of a component, for example of a stacked OLED, is substantially higher than that of the individual emission units under the same test conditions. Furthermore, many charge carrier generation zone structures are not stable, for example at high temperatures of, for example, greater than 85° C. This leads in particular to the degradation of the charge carrier generation zone structure, so that it loses its functional capability. The inventors have recognized that, by means of a component having one charge carrier generation zone according to the invention, a charge carrier generation zone can be provided which has a sufficiently high stability even at high temperatures, in particular at a temperature of 85° C. The component according to the invention can thus be used for a wide variety of applications, for example in the automobile sector.

According to at least one embodiment, the component has an applied and/or generated voltage during operation. The applied and/or generated voltage is lower compared to a voltage which is applied and/or produced on a component which, as an intermediate region, comprises either an inorganic intermediate layer or an organic intermediate layer.

The invention further relates to a lamp. The luminaire or lamp preferably has an organic light-emitting component. All stated definitions and embodiments of the organic light-emitting component therefore also apply to the lamp and vice versa.

According to at least one embodiment, the lamp is a tail lamp of an automobile. In particular, the rear light is a tail light of an automobile. Each two-track vehicle, for example a passenger vehicle (PKW) or a heavy goods vehicle (truck, LKW), can be named as an automobile. Alternatively, the lamp can be a tail light or tail light of a single-track vehicle, for example a motorcycle or a bicycle.

The rear light can comprise a braking function or be formed as a brake light. The lamp then has in particular a stop light function.

The light, lamp or luminaire can have a flashing function or be formed as a turn indicator.

The light can be a rear fog lamp.

According to at least one embodiment, the lamp is a front lamp of an automobile. In particular, the lamp is set up for this purpose, during operation of the automobile at brightness, that is to say as a daytime running light luminaire, to emit radiation. In particular, the lamp then emits white light.

According to at least one embodiment, the lamp has a light guide function.

According to at least one embodiment, the organic light-emitting component has an encapsulation. The encapsulation is preferably applied in the form of a thin-film encapsulation on the organic light-emitting component. In particular, the encapsulation protects the functional layer stack and the electrodes from the surroundings, such as, for example, from moisture and/or oxygen and/or other corrosive substances, such as hydrogen sulfide. The encapsulation can have one or more thin layers, which can be produced, for example, by means of chemical vapor deposition (CVD) or PECVD ("plasma-enhanced chemical vapor deposition") and/or of an atomic layer deposition (ALD) method and which, for example, comprise one or more of the materials silicon oxide, silicon carbide, silicon nitride, aluminum oxide, tin oxide, zirconium oxide, titanium oxide, hafnium oxide, lanthanum oxide and tantalum oxide. The encapsulation can furthermore comprise, for example on a thin-film encapsulation, a mechanical protection from a plastic layer and/or a laminated glass layer and/or laminated metal foil, for example made of aluminum. In this way, for example, a scratch protection can be achieved.

Alternatively, other encapsulations are also possible, for example in the form of a glued-on glass cover. In particular, the glass lid or the glass is arranged on a thin-film encapsulation by means of an adhesive or an adhesive layer.

According to at least one embodiment, the organic light-emitting component has current spreading structures. The current spreading structures are arranged in particular between the electrode facing the substrate, which is in particular transparent. The current expansion structure can be coated by means of an insulating layer, for example from a polyimide-based photoresist.

The invention further relates to a method for producing an organic light-emitting component. In particular, the method produces the organic light-emitting component and/or the lamp with the organic light-emitting component. The previously described definitions and embodiments for the organic light-emitting component and/or the lamp also apply to the method for producing an organic light-emitting component and vice versa.

According to at least one embodiment, the method for producing an organic light-emitting component comprises the following method steps:
A) provision of an electrode,
B) applying an organic light-emitting layer to the electrode,
C) applying an organic layer to the surface formed under step B), wherein the organic layer is electron- and/or hole-conducting,
D) applying of an intermediate region comprising an inorganic intermediate layer and an organic intermediate layer,
E) applying a further organic layer to the intermediate region. In the event that the organic layer applied under step C) is electron-conducting, the organic layer applied under step E) is hole-conducting and vice versa.
F) applying a further organic light-emitting layer to the further organic layer, and
G) applying a further electrode to the further organic light-emitting layer produced in step F).

According to at least one embodiment, the electrode produced in step A) is applied to a substrate. In particular, the electrode produced in step A) is transparent, in particular formed from TCO. In particular, the further electrode produced under step G) is formed to be reflective, so that the radiation generated by the component is coupled out in the main direction x of the electrode produced in step A).

In particular, the organic layer applied in step C) is an electron-conducting organic layer and the organic layer applied in step E) is a hole-conducting organic layer, or the organic layer applied in step C) is an electron-conducting organic layer and the organic layer applied in step E) is a hole-conducting organic layer.

When stating that a layer is arranged "on" or "over" another layer, this can mean here and in the following that the one layer is arranged in direct mechanical and/or electrical contact on the other layer. Furthermore, it can also mean that the one layer is arranged indirectly over another layer. In this case, further layers can be arranged between the one and the other layer. In particular, further hole transport layers, hole blocking layers, electron transport layers, electron blocking layers can be arranged between the one layer and the other layer.

According to at least one embodiment, the intermediate region produced in step D) is applied by means of vacuum evaporation. Alternatively or additionally, the intermediate region can be produced from the liquid phase in step D). Spin coating, screen printing, inkjet, engraving printing or flexographic printing can be used as a method. During production, an intermediate region can be produced which has an inorganic intermediate layer and an organic intermediate layer.

Further advantages, advantageous embodiments and developments will become apparent from the exemplary embodiments described below in conjunction with the figures.

BRIEF DESCRIPTION OF THE FIGURES

FIG. 1 shows a schematic illustration of an organic light-emitting component according to an embodiment, FIG. 2A shows a schematic illustration of an organic light-emitting component according to an embodiment, FIG. 2B shows experimental data of comparative examples and exemplary embodiments, FIG. 3A shows a schematic illustration of an organic light-emitting component according to an embodiment, FIG. 3B shows experimental data of comparative examples and exemplary embodiments, FIG. 4A shows a plan view and side view of a lamp according to an embodiment, FIG. 4B shows a plan view of a lamp according to an embodiment.

Figure 5A:
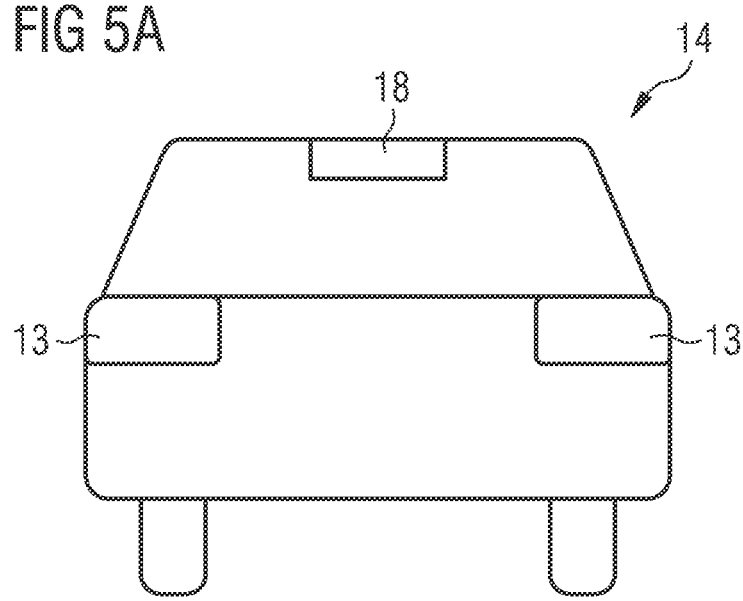
FIGS. 5A and 5B show the front and rear views of an automobile according to an embodiment.

In the exemplary embodiments and figures, identical or identically acting elements can in each case be provided with the same reference symbols. The elements illustrated and their size relationships among one another are not to be regarded as true to scale. Rather, individual elements such as, for example, layers, components, devices and regions can be represented with an exaggerated size for better representability and/or for a better understanding.

FIG. 1 shows a schematic illustration of an organic light-emitting component 100 according to an embodiment. The organic light-emitting component 100 has an electrode 1. The electrode 1 is preferably formed from a transparent conductive material, for example ITO. In particular, the electrode has a layer thickness of 100 to 150 nm, for example 130 nm. The electrode 1 can be arranged on a substrate 10 (not shown here).

A functional layer stack 9 is subsequently arranged downstream of the electrode 1. The functional layer stack 9 has at least two organic light-emitting layers 2, 7 and at least one charge carrier generation zone 3. In particular, the organic light-emitting layers 2, 7 each have a layer thickness of 10 to 50 nm, for example 30 nm. The charge carrier generation zone 3 has in particular a total thickness of less than or equal to 240 nm, particularly preferably 180 nm or 120 nm or 85 nm. The charge carrier generation zone 3 has an electron-conducting organic layer 31, a hole-conducting organic layer 32 and an intermediate region 4. In particular, the hole-conducting organic layer 32 has a layer thickness of between 30 and 200 nm inclusive, for example 130 nm, and the electron-conducting organic layer has a layer thickness of between 20 nm and 90 nm inclusive, for example 35 nm.

The intermediate region 4 comprises an organic intermediate layer 6 with a first charge transport mechanism and an inorganic intermediate layer 5 with a second charge carrier transport mechanism. In particular, the organic and inorganic intermediate layers 5, 6 each have a layer thickness of between 0.5 nm and 10 nm inclusive. In particular, the layer thickness of the inorganic intermediate layer 5 is smaller than or equal to the layer thickness of the organic intermediate layer 6; for example, the organic intermediate layer 6 has a layer thickness of between 2 nm and 6 nm inclusive, and the inorganic interlayer 5 has a layer thickness of between 0.5 nm and 3 nm inclusive.

Preferably, the first charge carrier transport mechanism of the organic intermediate layer 6 differs at least partially from the second charge carrier transport mechanism of the inorganic intermediate layer 5. In other words, the intermediate layers differ in terms of their property to transport charge carriers. Thus, in particular, the organic intermediate layer 6 can also perform the hopping mechanism in addition to the tunnel-type mechanism on account of the intermediate states of the organic materials thereof. The inorganic intermediate layer 5 does not have such a hopping mechanism. In addition, the inorganic intermediate layer 5 can be designed to act as an n-type dopant. This is preferably the case when the inorganic intermediate layer is composed of a non-noble metal, for example of magnesium, ytterbium, calcium or aluminum. The organic intermediate layer 6 comprises, in particular, a material made of phthalocyanine or a phthalocyanine derivative. In particular, the organic intermediate layer 6 is formed from phthalocyanine or its derivatives. The organic light-emitting component 100 is designed in particular to emit radiation from the red wavelength range. The radiation from the red wavelength range preferably has a dominant wavelength of 625 nm±3 nm. The organic light-emitting component 100 can additionally have an encapsulation (not shown here).

The organic light-emitting component 100 has a further electrode 8 arranged downstream of the functional layer stack 9. The electrode is preferably formed from a reflecting material, for example aluminum. In particular, the electrode is formed as an anode and the further electrode is formed as a cathode. The further electrode 8 has in particular a layer thickness of 100 nm to 250 nm, for example 200 nm. The organic light-emitting component 100 is thus formed as a so-called bottom emitter, so that the radiation produced in the organic light-emitting layers 2, 7 is coupled out in the main direction x via the transparent electrode 2. FIG. 1 also shows the position P equal to zero (P=0).

FIG. 2A shows a schematic side view of an organic light-emitting component 100 according to an embodiment. The organic light-emitting component 100 of FIG. 2A differs from the organic light-emitting component 100 of FIG. 1 in that the organic light-emitting component 100 of FIG. 2A comprises additional layers, in particular blocking layers, injection layers and/or transport layers. The component 100 has a hole injection layer 301 and a further electron blocking layer 2021 between the electrode 1 and the organic light-emitting layer 2.

The hole injection layer 301 is in particular p-doped and/or has in particular a layer thickness of between 50 and 500 nm, for example 235 or 340 nm. The further electron-blocking layer 2021 has a layer thickness of between 5 and 20 nm, for example 10 nm. The materials mentioned above can, for example, be used as materials for these layers.

A hole blocking layer 201 is arranged between the organic light-emitting layer 2 and the hole-conducting organic layer 31. In particular, the hole blocking layer 201 is arranged in direct contact between the organic light-emitting layer 2 and the electron-conducting organic layer 31. An electron blocking layer 202 is arranged between the hole-conducting organic layer 32 and the further organic light-emitting layer 7. The electron blocking layer 202 has in particular a layer thickness of between 5 nm and 20 nm, for example 10 nm. The materials mentioned above can be used, for example, as materials for the electron-blocking layer.

An electron injection layer 302 is arranged between the further organic light-emitting layer 7 and the further electrode 8, which is in particular n-doped and/or has a layer thickness of between 30 and 80 nm, for example 45 nm. A further blocking layer 2011 is arranged downstream of the further organic light-emitting layer 7. The further blocking layer 2011 in particular has a layer thickness of between 5 nm and 15 nm, for example 20 nm. The further blocking layer and the electron injection layer 302 can be made of the above-mentioned materials.

Preferably, the organic light-emitting component 100 of FIG. 2A is configured to emit radiation from the red wavelength range. In particular, the organic light-emitting component is shaped as a rear light or as a daytime running light of an automobile. In particular, at a temperature of greater than 70° C., for example greater than or equal to 85° C., the organic light-emitting component 100 is stable against degradation.

FIG. 2B shows the experimental data of the comparative examples V1 and V2 and of the exemplary embodiments A1 and A2. In particular, the comparative example V1 is to be compared with the exemplary embodiment A1, and the comparative example V2 is to be compared with the exemplary embodiment A2. The comparative examples V1 and V2 and the exemplary embodiments A1 and A2 essentially have a layer structure according to the organic light-emitting component 100 of FIG. 2A.

The components of examples V1 and A1 to be compared are constructed identically with the exception that the comparative example V1 has no organic intermediate layer 6 but only an inorganic intermediate layer 5 as an intermediate region 4. The exemplary embodiment A1, on the other hand, has both an organic intermediate layer 6 and an inorganic intermediate layer 5.

The components of examples V2 and A2 to be compared are constructed identically with the exception that the comparative example V2 does not have an organic intermediate layer 6 but only an inorganic intermediate layer 5 as an intermediate region 4. The exemplary embodiment A2, on the other hand, has both an organic intermediate layer 6 and an inorganic intermediate layer 5.

Examples V1 and A1 differ from examples V2 and A2 in that they have a different electron-conducting organic layer 31. In particular, the electron-conducting organic layer is doped differently.

The respective organic intermediate layer 6 of examples A1 and A2 has a layer thickness of 4 nm in each case. The respective inorganic intermediate layer 5 of examples V1, V2, A1 and A2 has a layer thickness of 2 nm in each case.

In particular, the organic intermediate layer 6 is composed of a phthalocyanine or its derivatives and the inorganic intermediate layer 5 of the corresponding examples V3, V4, A3 and A4 is formed from calcium.

The measurements were carried out at 2600 cd/m² in a reflective component, that is to say a bottom emitter in an Ulbricht sphere. The experimental data show the luminance L in candela per square meter (cd/m²), the light yield Peff in lumens per watt (lm/W), the current efficiency Ieff in candela per ampere (cd/A), the quantum yield EQE in percent, the color location CX CY, the voltage U in volts (V), the current density I in milliamperes per square centimeter (mA/cm²). Furthermore, the experimental data show a life test LT70 in hours (h) at different temperatures (50° C., 85° C. and 95° C.) and different current intensities (100 mA/cm², 50 mA/cm²). The service life test LT70 indicates how many hours are required for that the luminous flux has 70% of the initial brightness. In other words, the service life of the organic light-emitting component is specified in hours with a degradation of 30%.

The comparison of the comparative example V1 to the exemplary embodiment A1 shows that, by using an intermediate region 4 consisting of a combination of an inorganic intermediate layer 5 and an organic intermediate layer 6, a voltage reduction from 10.5 volts to 9.5 volts can be produced.

In comparison to the exemplary embodiment A2, the comparative example V2 likewise shows a voltage reduction from 10.1 volts to 9.1 volts by the incorporation of the additional organic intermediate layer 6 into the organic light-emitting component 100.

It can be seen from the experimental data that a voltage reduction through the additional organic intermediate layer 6 takes place at the same (exemplary embodiment A1) or higher (exemplary embodiment A2) service life compared to the comparative examples.

The service life test is shown as a function of the temperature, which shows that by increasing the temperature from 50° C. to 95° C. the service life decreases in hours. In particular, the exemplary embodiments A1 and A2 have a longer service life at the corresponding temperature in the tendency compared to the comparative examples V1 and V2.

The exemplary embodiment A1 shows, in comparison to the comparative example V1 at 95° C., an identical service life (400 h) but a lower voltage.

FIG. 3A shows a schematic side view of an organic light-emitting component 100 according to an embodiment. The component 100 of FIG. 3A corresponds substantially to the organic light-emitting component 100 of FIG. 2A. In this case, the layer thicknesses of the layers, in particular of the intermediate region 4, can differ from one another.

FIG. 3B shows the experimental data measured with the component 100 of FIG. 3A. FIG. 3B shows the experimental data of the comparative examples V3 and V4 and the exemplary embodiments A3 and A4. In particular, the comparative example C3 is to be compared with the exemplary embodiment A3, and the comparison example V4 is to be compared with the exemplary embodiment A4.

The components of examples C3 and A3 to be compared are constructed identically with the exception that the comparative example C3 has no inorganic intermediate layer 5 but only an organic intermediate layer 6. The exemplary embodiment A3, on the other hand, has both an organic intermediate layer 6 and an inorganic intermediate layer 5.

The components of examples V4 and A4 to be compared are constructed identically with the exception that the comparative example V4 has no inorganic intermediate layer 5 but only an organic intermediate layer 6 as an intermediate region 4. The exemplary embodiment A5, on the other hand, has both an organic intermediate layer 6 and an inorganic intermediate layer 5.

Examples C3 and A3 differ from examples V4 and A4 in that they have a different layer thickness of the organic intermediate layer 6.

The respective organic intermediate layer 6 of examples A3 and V3 has a layer thickness of 2 nm in each case. The respective organic intermediate layer 6 of examples A4 and V4 has a layer thickness of 4 nm in each case. The respective inorganic intermediate layer 5 of examples A3 and A4 has a layer thickness of 2 nm in each case.

In particular, the organic intermediate layer 6 is composed of a phthalocyanine or its derivatives and the inorganic intermediate layer 5 of the corresponding examples V3, V4, A3 and A4 is formed from calcium.

The determined experimental data correspond to those of FIG. 2A and were also measured at 2600 candela per square meter in a bottom emitter and an Ulbricht sphere. The life test LT70 in hours (h) was carried out only at 85° C. at different current intensities (100 mA/cm², 50 mA/cm²).

Among other things, the experimental data can be seen to be characterized in that, by using an inorganic intermediate layer 5 and organic intermediate layer 6 as an intermediate region 4, a voltage reduction from 9.6 volts to 8.9 volts (comparison V3 with A3) or from 9.3 volts to 9.0 volts (comparison V4 with A4) can be induced in comparison to the fact that only one organic intermediate layer 6 is used as an intermediate region 4. Furthermore, the service life can be increased by incorporating the additional inorganic intermediate layer 5 compared to the comparative examples (from 1200 hours to 1400 hours or 600 hours to 650 hours).

The use of an inorganic and organic intermediate layer in an OLED according to the invention is advantageous in comparison to a comparative OLED having only one intermediate layer at high temperatures of, for example, 85° C. In addition, the operating voltage and self-heating of the exemplary embodiments are lower, so that the operation of the OLED according to the invention and of the comparative OLED results in the same ambient temperatures, characterized in that the OLED according to the invention has a lower OLED temperature than the comparative OLED. At the same ambient temperatures, the stability of the OLED according to the invention is greater than that of the comparative OLED.

FIG. 4A shows a schematic plan view and side view of a lamp, light or lamp 17 according to an embodiment. The lamp 17 is in particular a rear lamp 12, preferably a tail light 13 of an automobile. The lamp 17 comprises at least one organic light-emitting component 100, which has, for example, the structure of FIG. 2A or 3A. The lamp 17 and/or the organic light-emitting component 100 are shaped in a rectangular shape in a plan view. The organic light-emitting component 100 can have an encapsulation and a substrate 10 in addition to the component of FIGS. 3A and 2A. The component 100 can be introduced into a housing 15. The housing 15 can, for example, be made of plastic.

FIG. 4B shows a schematic plan view of a lamp 17 according to an embodiment. The lamp 17 of FIG. 4B differs from FIG. 4A in that the light or lamp 17 and/or the organic light-emitting component 100 and/or the housing 15 have a geometric shape in plan view which is different from the rectangular shape. In principle, any design form is conceivable.

Figure 5B:
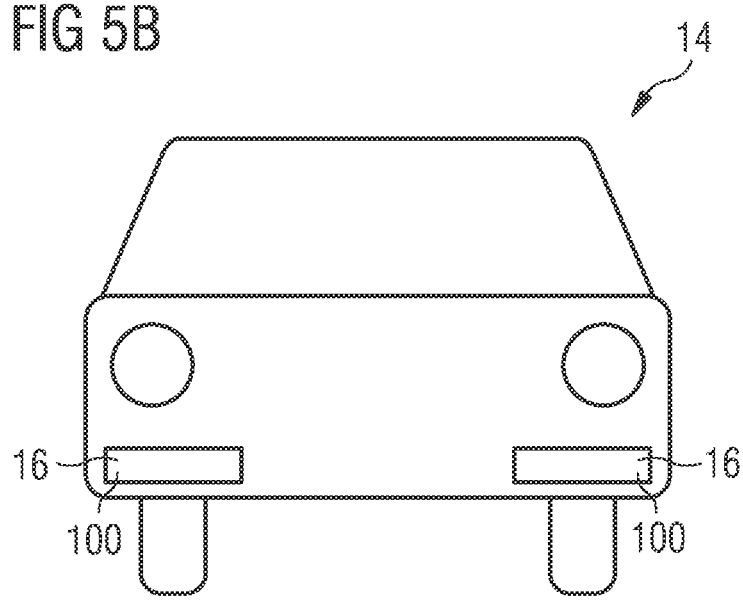

FIGS. 5A and 5B show a rear view and front view of an automobile 14, in particular of a passenger vehicle. The automobile 14 has at least one or a plurality of organic light-emitting components 100. The organic light-emitting components 100 are arranged in a lamp, in particular a tail light 13 or rear lamp 12 or in a front lamp 16.

FIG. 5A shows a brake light 18 and tail lights 13.

FIG. 5B shows the front view of an automobile, in particular front lights 16, wherein, in particular, the front lights 16 are formed as a daytime running light luminaire and each comprise at least one organic light-emitting component 100.

The organic light-emitting component 100 according to the invention can be used in a rear light. For example, the organic light-emitting component 100 can be used as a brake light 18 or in a tail light 12 or in a lamp 17 with a stop light function. Alternatively or additionally, the organic light-emitting component 100 can be used as a turn indicator and/or shunt light. The organic light-emitting component 100 can be formed as a daytime running light luminaire or with a light guide function.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 201 5 114 084. 5, the disclosure content of which is hereby incorporated by reference.

LIST OF REFERENCE NUMERALS 100 organic light-emitting component
1 electrode
2 organic light-emitting layer
3 charge carrier generation zone
31 electron-conducting organic layer
32 hole-conducting organic layer
4 intermediate region
5 inorganic intermediate layer
6 organic intermediate layer
7 (further) organic light-emitting layer
8 (further) electrode
9 functional layer stack
10 substrate
11 radiation generated in the organic light-emitting layers
12 tailback
13 tail light
14 automobile
15 housing
16 front light
X main direction
P position
N mean refractive index of the functional layer stack
Λ wavelength
k natural number greater than or equal to zero
201 hole blocking layer
2011 further hole blocking layer
202 electron blocking layer
2021 further electron blocking layer
301 hole injection layer
302 electron injection layer

The invention claimed is:
1. An organic light-emitting component comprising
a functional layer stack arranged between two electrodes,
wherein the functional layer stack comprises at least two organic light-emitting layers and at least one charge carrier generation zone, which is arranged between the two organic light-emitting layers,
wherein the charge carrier generation zone comprises an electron-conducting organic layer and a hole-conducting organic layer, between which an intermediate region is arranged,
wherein the intermediate region comprises at least one organic intermediate layer having a first charge carrier transport mechanism and an inorganic intermediate layer having a second charge carrier transport mechanism,
wherein the inorganic intermediate layer is arranged between the organic intermediate layer and the electron-conducting organic layer, and
wherein the first charge carrier transport mechanism differs at least partially from the second charge carrier transport mechanism,
wherein the organic intermediate layer has at least one material selected from a group consisting of phthalocyanine, phthalocyanine derivative, naphthalocyanine, naphthalocyanine derivative, porphyrin and porphyrin derivative, wherein the inorganic intermediate layer comprises at least one metal or semi-metal, which is selected from a group consisting of Li, Na, K, Rb, Cs, Be, Mg, Ca, Sr, Ba, B, Al, Ag, Yb, Ga, In, Tl and combinations thereof, and wherein the at least two organic light-emitting layers are each designed to emit radiation from the red wavelength range, wherein the organic light-emitting layers extend along a main direction (x) in each case at a position (P) according to the following formula, with a tolerance of at most $\lambda/(10\ n)$: $P=\lambda/(4\ n)+k\ \lambda/(2\ n)$, wherein n is the average refractive index of the functional layer stack for the wavelength $\lambda$ and k is a natural number greater than or equal to zero.

2. An organic light-emitting component comprising a functional layer stack arranged between two electrodes, wherein the functional layer stack comprises at least two organic light-emitting layers and at least one charge carrier generation zone, which is arranged between the two organic light-emitting layers, wherein the charge carrier generation zone comprises an electron-conducting organic layer and a hole-conducting organic layer, between which an intermediate region is arranged, wherein the intermediate region comprises at least one organic intermediate layer having a first charge carrier transport mechanism and an inorganic intermediate layer having a second charge carrier transport mechanism, wherein the inorganic intermediate layer is arranged between the organic intermediate layer and the electron-conducting organic layer, and wherein the first charge carrier transport mechanism differs at least partially from the second charge carrier transport mechanism, wherein the organic intermediate layer has at least one material selected from a group consisting of phthalocyanine, phthalocyanine derivative, naphthalocyanine, naphthalocyanine derivative, porphyrin and porphyrin derivative, and wherein the inorganic intermediate layer comprises at least one metal or semi-metal, which is selected from a group consisting of Li, Na, K, Rb, Cs, Be, Mg, Ca, Sr, Ba, B, Al, Ag, Yb, Ga, In, Tl and combinations thereof, and wherein the organic light-emitting layers extend along a main direction (x) in each case at a position (P) according to the following formula, with a tolerance of at most $\lambda/(10\ n)$: $P=\lambda/(4\ n)+k\ \lambda/(2\ n)$, wherein n is the average refractive index of the functional layer stack for the wavelength $\lambda$ and k is a natural number greater than or equal to zero.

3. The organic light-emitting component according to claim 2, which has an applied and/or generated voltage in operation, wherein the applied and/or generated voltage is lower compared to a voltage which is applied to a component which comprises, as an intermediate region, either an inorganic intermediate layer or an organic intermediate layer.

4. The organic light-emitting component according to claim 2, wherein the organic intermediate layer comprises at least one phthalocyanine and/or a phthalocyanine derivative, wherein the phthalocyanine and/or the phthalocyanine derivative are each coordinated to a metal or a metal compound, wherein the metal or the metal compound is selected from the group consisting of Cu, Zn, Co, Al, Ni, Fe, SnO, Mn, Mg, VO and TiO.

5. The organic light-emitting component according to claim 2, wherein the inorganic intermediate layer comprises a non-noble metal and is designed as an n-type dopant.

6. The organic light-emitting component according to claim 2, wherein the organic intermediate layer comprises a phthalocyanine or phthalocyanine derivative and the inorganic intermediate layer comprises aluminum.

7. The organic light-emitting component according to claim 2, wherein the organic intermediate layer comprises a phthalocyanine or phthalocyanine derivative and the inorganic intermediate layer comprises calcium.

8. The organic light-emitting component according to claim 2, wherein the organic intermediate layer comprises a phthalocyanine or phthalocyanine derivative and the inorganic intermediate layer comprises magnesium.

9. The organic light-emitting component according to claim 2, wherein the organic intermediate layer comprises a phthalocyanine or phthalocyanine derivative and the inorganic intermediate layer comprises ytterbium.

10. The organic light-emitting component according to claim 2, wherein the dominant wavelength of the red wavelength range is 625 nm+/3 nm.

11. The organic light-emitting component according to claim 2, wherein the one electrode is transparent and the further electrode is formed to be reflective, so that the light emitted in the organic light-emitting layers is coupled out in the main direction (x) via the transparent electrode.

12. The organic light-emitting component according to claim 2, wherein the organic and inorganic intermediate layers each have a layer thickness of between 0.5 nm and 10 nm inclusive, wherein the layer thickness of the inorganic intermediate layer is smaller than or equal to the layer thickness of the organic intermediate layer.

13. The organic light-emitting component according to claim 2, wherein the charge carrier generation zone has a total thickness of less than or equal to 240 nm.

14. The organic light-emitting component according to claim 2, which is stable with respect to degradation at a temperature of greater than 75° C.

15. A lamp, which comprises an organic light-emitting component according to claim 2.

16. The lamp according to claim 15, which is a tail light of an automobile.

* * * * *